United States Patent
Kennon

(10) Patent No.: US 7,027,964 B2
(45) Date of Patent: Apr. 11, 2006

(54) METHOD AND SYSTEM FOR SOLVING FINITE ELEMENT MODELS USING MULTI-PHASE PHYSICS

(75) Inventor: Stephen R. Kennon, Austin, TX (US)

(73) Assignee: Object Reservoir, Inc., Austin, TX (US)

(*) Notice: Subject to any disclaimer, the term of this patent is extended or adjusted under 35 U.S.C. 154(b) by 831 days.

(21) Appl. No.: 09/896,137

(22) Filed: Jun. 29, 2001

(65) Prior Publication Data

US 2002/0046014 A1 Apr. 18, 2002

Related U.S. Application Data

(60) Provisional application No. 60/215,697, filed on Jun. 29, 2000.

(51) Int. Cl.
*G06F 7/60* (2006.01)

(52) U.S. Cl. .............................. 703/2; 703/10
(58) Field of Classification Search .................. 703/2, 703/5, 10; 716/20; 324/637; 345/419; 382/109
See application file for complete search history.

(56) References Cited

U.S. PATENT DOCUMENTS

| | | | |
|---|---|---|---|
| 3,029,018 A | 4/1962 | Floyd, Jr. | |
| 3,302,710 A | 2/1967 | Odeh | |
| 4,821,164 A | 4/1989 | Swanson | |
| 5,255,212 A | 10/1993 | Kondoh et al. | |
| 5,432,718 A | 7/1995 | Molvig et al. | |
| 5,553,009 A | 9/1996 | Meshkat et al. | |
| 5,572,634 A | 11/1996 | Duluk, Jr. | |
| 5,604,911 A * | 2/1997 | Ushiro | 703/2 |
| 5,617,322 A | 4/1997 | Yokota | |
| 5,675,521 A | 10/1997 | Holzhauer et al. | |
| 5,699,271 A * | 12/1997 | Sagawa et al. | 716/20 |

(Continued)

FOREIGN PATENT DOCUMENTS

| | | |
|---|---|---|
| EP | 0 709 789 A2 | 5/1996 |
| EP | 0 801 364 B1 | 7/2003 |
| FR | 2775094 | 8/1999 |
| GB | 2326747 A | 12/1998 |
| WO | WO 99/40532 | 8/1999 |
| WO | WO 99/52048 | 10/1999 |
| WO | WO 99/57418 | 11/1999 |

OTHER PUBLICATIONS

Benedeck, "Capacitances of planar multiconductor configuration on a dielectric substrate by a mixed order finite-element method", IEEE 1974.*

Fu et al., "Time integration procedures for a cyclic thermo-viscoplasticity model for Pb–Sn solder applications", IEEE 1996.*

P.A. Forsyth, et al., "Local Mesh Refinement and Modeling of Faults and Pinchouts", SPE Form Evaluation, Jun. 1986, vol. 1, No. 3, pp. 275–285. XP–002191830.

(Continued)

*Primary Examiner*—Kevin J. Teska
*Assistant Examiner*—Kandasamy Thangavelu
(74) *Attorney, Agent, or Firm*—Toler, Larson & Abel, LLP

(57) ABSTRACT

Systems and methods for solving finite element models, wherein the matrix that governs the solution is modified by adjusting the weighting coefficients of the matrix so that the elements which lie on the diagonal of the matrix are non-negative and the elements which are off the diagonal are non-positive. In one embodiment, a system is discretized on a finite element mesh with the contribution of each node to the discretization being weighted based upon the direction of fluid flow across each element. The nodes which are upstream from the other nodes of the respective elements are weighted more heavily to cause the resulting matrix to be substantially diagonal. This matrix is solved using traditional techniques.

23 Claims, 6 Drawing Sheets

U.S. PATENT DOCUMENTS

| | | | |
|---|---|---|---|
| 5,710,726 A | | 1/1998 | Rowney et al. |
| 5,740,342 A | | 4/1998 | Kocberber |
| 5,754,181 A | * | 5/1998 | Amdursky et al. ......... 345/419 |
| 5,891,131 A | | 4/1999 | Rajan et al. |
| 5,966,524 A | * | 10/1999 | Burnett et al. ................. 703/5 |
| 5,999,187 A | | 12/1999 | Dehmlow et al. |
| 6,014,473 A | | 1/2000 | Hossack et al. |
| 6,018,497 A | | 1/2000 | Gunasekera |
| 6,028,607 A | | 2/2000 | Chan |
| 6,041,017 A | | 3/2000 | Goldsberry |
| 6,052,520 A | * | 4/2000 | Watts, III ................... 703/10 |
| 6,054,992 A | | 4/2000 | Gibson |
| 6,064,810 A | | 5/2000 | Raad et al. |
| 6,070,125 A | | 5/2000 | Murphy et al. |
| 6,078,869 A | | 6/2000 | Gunasekera |
| 6,106,561 A | | 8/2000 | Farmer |
| 6,191,796 B1 | | 2/2001 | Tarr |
| 6,313,837 B1 | | 11/2001 | Assa et al. |
| 6,445,390 B1 | | 9/2002 | Aftosmis et al. |
| 6,448,788 B1 | * | 9/2002 | Meaney et al. ............. 324/637 |
| 6,516,080 B1 | * | 2/2003 | Nur ............................. 382/109 |
| 6,552,724 B1 | | 4/2003 | Marshall |
| 6,587,104 B1 | | 7/2003 | Hoppe |
| 6,608,628 B1 | | 8/2003 | Ross et al. |
| 6,674,432 B1 | | 1/2004 | Kennon et al. |
| 6,816,820 B1 | | 11/2004 | Friedl et al. |

OTHER PUBLICATIONS

Y. Ding, et al., "Developement of Dynamic Local Grid Refinement in Reservoir Simulation", Proceedings of the 13th SPE Symposium on Reservoir Simulation, New Orleans, LA, Feb.–Mar. 1993, pp. 501–510. XP–002191831.

S. Verna, et al., "A Control Volume Scheme for Flexible Frids in Reservoir Simulation", Proceedings of the 1997 SPE Reservior Simulation Symposium, Dallas, TX, Jun. 1997, pp. 215–227, XP–002191832.

S. Kocberber, et al., "An Automatic, Unstructured Control Volume Generation System for Geologically Complex Reservoirs", Proceedings of the 1997 SPE Reservoir Simulation Symposium, Dallas, TX, Jun. 1997, pp. 241–252. XP–002191833.

Y. Kuwauchi, et al., "Development and Applications of a Three Dimentsional Voronoi–Based Flexible Grid Black Oil Reservoir Simulator", SPE Asia Specific Oil & Gas Congerence, Adelaide, Australia, Oct. 1996, pp. 1–12. XP–002191834.

R. Page, et al., "A Functional Program Describing a Simple Reservoir Model and Its Potential for Parallel Computation", Proceedings of the 1990 Symposium on Applied Computing, IEEE, Apr. 1990, pp. 85–91.

C. Giertsen, et al., "Volume Visulization of Sparse Irregular Meshes", Computer Graphics and Applications, IEEE, vol. 2, No. 2, Mar. 1992, pp. 40–48.

S. Ghosh, "Curvilinear Local Grid Refinement", SPE 50633, SPE European Petroleum Conference, The Netherlands, Oct. 20–22, 1998.

H. N. Sharpe, et al., "A New Adaptive Orthogonal Grid Generation Procedure for Reservoir Simulation" 65th Annual Technical Conference and Exhibition of the Society of Petroleum Engineers, New Orleans, LA, Sep. 23–26, 1990.

M. Wheeler, et al., "A Parallel Multiblock/Multidomain Approach for Reservoir Simulation", Proceedings of the 1999 15th Symposium on Reservoir Simulation, Houston, TX, Feb. 1999. XP–002188857.

D. Kahaner, et al., "An Expreimental Algorithm for N–Dimensional Adaptive Quadrature", ACM Transactions on Mathematical Software (TOMS), Mar. 1979, pp. 86–96.

Y. Ozdogan, "Seismic Data Processing", Society of Exploration Geophysics, Tulsa, OK, 1991, p. 514–515.

S. Norris, et al., "Modeling Fluid Flow Around Horizontal Wellbores", Proceedings: SPE Annual Technical Conference and Exhibition 1990 Part 4, New Orleans, LA Sep. 23–26, 1990, vol. SIGMA, pp. 65–75.

P. Perrochet, "Finite Hyperelements: A 4D Geometrical Framework Using Coariant Baes and Metric Tensors" Communications in Numberical Methods in Engineering, Jun. 1995, UK, vol. 11, No. 6, pp. 525–534.

J.M.M. Regtien, et al., "Interactive Reservoir Simulation", Proceedings of the 13th Symposium on Reservoir Simulation, San Antonio, TX Feb. 12–15, pp. 545–552.

C. Buckalew, et al., "Oilfield Visulization on the PC Platform", 2000 SPE/AAPG Western Regional Meeting, Jun. 19–23, 2000, pp. 1–5.

E. Farkas, Linearization Techniques of Reservoir Simulation Equations: Fully Implicit Cases, Proceedigns of the 1997 SPE Reservoir Simulation Symposium, Dallas, Texas Jun. 8–11, 1997, pp. 87–95.

E. Farkas, Linearization Techniques of Reservoir Simulation Equations: Fully Implicit Cases, Richardson, Texas, Dec. 1998, vol. 3, No. 4, pp. 316–323.

P. Benedeck, Capacitances of Planar Multiconductor Configuration on a Dielectric Substrate by a Mixed Order Finite–Element Method, IEEE1974.

Fu, et al., Time Integration Procedures for a Cyclic Thermoviscoplasticity Model for Pb–Sn solder applications, IEEE 1996.

P. J. Zwart, et al., "Space–Time Meshing for Two–Dimensional Moving Boundary Problems", Proceedings of the Seventh International Meshing Roundtable , pp. 187–199, 1998.

S. L. Ho, et al., "Generation and Rotation of 3–D Finite Element Mesh for Skewed Rotor Induction Motors Using Extrusion Technique", IEEE Transactions on Magnetics, pp. 1266–1269, May 1999.

Farkas, Linearization Techniques of Reservoir Simulation Equations: Fully Implicit Cases, Proceedings of the 1997 SPE Rervoir Simulation Symposium, Dallas, Texas Jun. 8–11, 1997, pp. 87–95.

Farkas, Linearization Techniques of Reservoir Simulation Equations: Fully Implicit Cases, Richardson, Texas Dec. 1998, vol. 3, No. 4, pp. 316–323.

International Search Report dated Mar. 11, 2002.

\* cited by examiner

METHOD AND SYSTEM FOR SOLVING FINITE ELEMENT MODELS USING MULTI-PHASE PHYSICS

RELATED APPLICATIONS

This application claims priority under 35 U.S.C. § 119(e) to U.S. Patent Application No. 60/215,697 entitled "Method and System for Oil Reservoir Simulation and Modeling" by Stephen R. Kennon, Kok Thye Lim, Scott A. Canaan, Steven B. Ward, Stuart W. Pond, Jr. and Edward J. Barragy, filed Jun. 29, 2000, which is incorporated by reference as if set forth in its entirety herein.

FIELD OF THE INVENTION

The invention relates generally to methods for modeling physical systems using finite element analysis and, more specifically, to methods for solving finite element models wherein the matrix that controls the solution for the model is configured to maintain the properties of monotonicity and linearity preservation.

BACKGROUND OF THE INVENTION

Physical systems can be modeled mathematically to simulate their behavior under certain conditions. There are a wide variety of means to model these systems, ranging from the very simplistic to the extremely complicated. One of the more sophisticated means to model physical systems is through the use of finite element analysis. As the name implies, finite element analysis involves the representation of individual, finite elements of the physical system in a mathematical model and the solution of this model in the presence of a predetermined set of boundary conditions. Another comparable means to model physical systems is through the use of finite difference analysis. Finite difference analysis involves the modeling of individual points within a modeled space and computing the differences between these points. Finite difference analysis is often used for simulating the dynamic behavior of fluids.

Traditional finite difference techniques and finite element techniques using streamlined, upwinding methods are typically used to simulate the production of oil in a reservoir. While each of these techniques has its own advantages, it also has its own disadvantages. Generally speaking, the finite difference techniques produce physically realistic results, but they are not very accurate. The finite element techniques, on the other hand, are more accurate, but they produce results which are not physically realistic.

As a result of their respective disadvantages, both the finite difference techniques and finite element techniques which are conventionally used normally require a great deal of computer resources. In the case of finite difference techniques, reasonable accuracy can be achieved, but this requires many more nodes then would be necessary in a finite element model. This increases the amount of memory and CPU time which are needed to compute an accurate solution. In the case of finite element techniques, comparable accuracy can be achieved with fewer nodes, but the solutions may not be realistic. For example, concentrations may be more than 100 percent, or permeabilities may be negative. Consequently, there may be problems for which the solution does not converge, or for which the solution may converge very slowly. These techniques are therefore less reliable and may require a large number of iterations before acceptable accuracy is achieved.

Because each of these standard techniques has its own drawbacks, and because these drawbacks increase in the amount of computer resources which are necessary to generate acceptable solutions, it would be desirable to provide a method for modeling systems such as oil reservoirs which reliably produces accurate, realistic solutions for these systems.

SUMMARY OF THE INVENTION

One or more of the problems outlined above may be solved by the various embodiments of the invention. Broadly speaking, the invention comprises systems and methods for solving finite element models, wherein the matrix that governs the solution is modified so that it satisfies the properties of monotonicity and preservation of linearity. This is accomplished by adjusting the weighting coefficients of the matrix so that the elements which lie on the diagonal of the matrix are non-negative and the elements which are off the diagonal are non-positive. This causes the solution to be both more accurate than traditional finite difference techniques and more realistic than traditional finite element techniques.

The present techniques may provide various advantages over the prior art. For instance, because the present techniques are more accurate, the number of iterations which are required to produce an acceptable result may be reduced, thereby conserving computing resources. The present techniques may also cause solutions to more reliably converge, since they are constrained to the range of realistic results and do not oscillate in the same manner as the solutions of traditional finite element techniques. The present techniques are therefore generally faster, more accurate, less resource-intensive and more reliable than prior art techniques.

One embodiment of the present invention comprises a method for generating a solution for a modeled system using finite element techniques, wherein the system is discretized on a finite element mesh and wherein the contribution of each node to the discretization is weighted based upon the direction of fluid flow across each element. The contributions are weighted to favor the nodes which are upstream from the other nodes of the respective elements. Weighting the contributions of the nodes in this manner causes the resulting matrix to be essentially diagonal. That is, the elements which lie on the diagonal of the matrix are emphasized, while the elements which are off the diagonal are de-emphasized. Once the matrix has been modified in this manner, it is solved using traditional techniques.

An alternate embodiment of the present invention comprises a method for modeling the flow of multiphase fluids in an oil reservoir. In this embodiment, a four dimensional finite element mesh corresponding to the oil reservoir is constructed. A solution is generated for the mesh by distributing the residuals of a finite element operator among the nodes of the mesh and then assembling and solving the system using traditional finite element techniques. In this embodiment, distributing the residual of the finite element operator comprises, for each element, computing the value of the finite element operator for each node, dividing these values into a set of positive values and a set of negative values, distributing the residual to the nodes to emphasize the diagonal elements and de-emphasize the off-diagonal elements and then computing a tangent operator for the matrix.

Another alternate embodiment of the present invention comprises a software product which is embodied in a computer readable medium. The software product comprises a plurality of instructions which are configured to cause a computer or any other data processor to perform the steps of a method in accordance with the present disclosure. The computer readable medium may comprise any of a number of different media, including but not limited to CD ROMs, DVDs, floppy disks, computer memories, magnetic tapes, etc. Still another alternate embodiment of the present invention comprises a computer system which is configured to perform the steps of a method in accordance with the present disclosure. The computer system may be programmed to perform such a method by instructions which are contained in hardware, firmware or software.

Numerous additional alternative embodiments are also possible.

BRIEF DESCRIPTION OF THE DRAWINGS

Other objects and advantages of the invention may become apparent upon reading the following detailed description and upon reference to the accompanying drawings.

Figure 1:
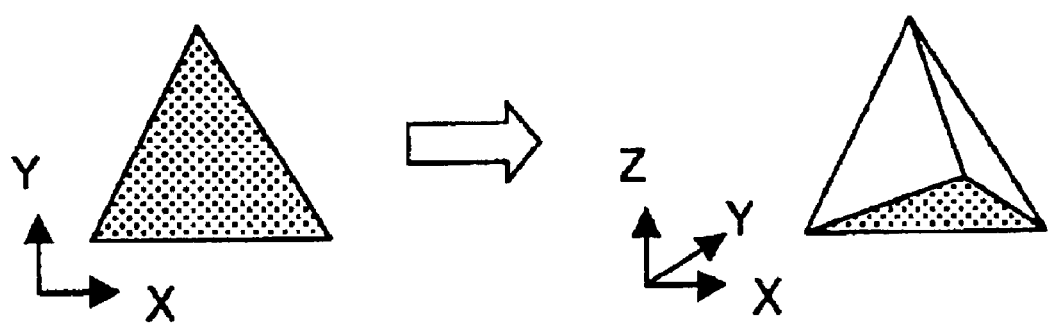
FIG. 1 is a diagram illustrating simplices in two and three dimensions.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF A PREFERRED EMBODIMENT

A preferred embodiment of the invention is described below. It should be noted that this and any other embodiments described below are exemplary and are intended to be illustrative of the invention rather than limiting.

Broadly speaking, the invention comprises methods for solving finite element models, wherein the solution is guaranteed both to be monotonic and to satisfy linearity preservation. This ensures that the solution will be both accurate and realistic. The monotonicity and the linearity of the solution are ensured by generating a matrix for the solution of the finite element model such that the elements of the matrix which are on the diagonal are non-negative, and the elements which are off-diagonal are non-positive. This matrix can then be solved using conventional finite element techniques to generate the desired accurate, realistic solution.

The present methods provide a number of advantages over traditional finite element and finite difference techniques. As indicated above, the present methods provide the accuracy of traditional finite element techniques without the disadvantages of unrealistic, oscillating solutions. Similarly, the present methods provide the stability of traditional finite difference techniques while providing much greater accuracy.

The accuracy and realism provided by the present methods lead to additional advantages in the utilization of computer resources. For example, the present methods may allow for faster generation of solutions for physical systems. This is a result of several things. First, because the solution is physically realistic, it does not oscillate, and consequently tends to converge more rapidly. Further, because generation of the solution using the present methods typically requires less iterations and is faster than traditional finite element techniques, less CPU time is required to generate the solution. The present methods may also use less memory than traditional techniques. Because the present methods are generally more accurate than traditional finite difference techniques, is not necessary to use as many nodes to model the physical system. Consequently, less memory is required to store the model (and less CPU time is required to compute a solution based on these nodes.) the present methods may also be more reliable than traditional techniques. The oscillation of solutions generated using traditional finite element techniques may, in some instances, prevent a solution from converging at all. As noted above, the present methods provide solutions which are realistic (e.g., they do not oscillate between realistic solutions and solutions which are not possible,) so the solutions will reliably converge.

In finite element modeling, the region that is to be analyzed is broken up into sub-regions called elements. This process of dividing the region into sub-regions may be referred to as discretization or mesh generation. The region is represented by functions defined over each element. This generates a number of local functions that are much simpler than those which would be required to represent the entire region. The next step is to analyze the response for each element. This is accomplished by building a matrix that defines the properties of the various elements within the region and a vector that defines the residuals acting on each element in the domain. Once all the element matrices and vectors have been created, they are combined into a matrix equation. After applying boundary conditions, the matrix equation can be solved to obtain unknown nodal responses. Intra-element responses can be interpolated from nodal values using the functions which were defined over each element.

The following description of one embodiment of the present method relates to the modeling of oil reservoirs. This embodiment is intended to be exemplary, and it should be noted that the present methods may be applied to a variety of physical systems, such as flow over aircraft, weather prediction, flow through internal combustion engines, and other industrial fluid flows. This list of potential applications of the present methods is intended to be illustrative rather than limiting.

The details of a preferred embodiment will be set forth below. It may be helpful, however, to first define a few terms.

A node is a point in space. In finite element modeling, nodes form the vertices of the elements which are modeled.

The nodes also form part of a mesh of nodes and edges which define the boundaries between elements in the modeled space.

An edge is a line between two nodes which form vertices of an element. The edges form part of the mesh which defines the boundaries between elements in the modeled space.

A simplex is a spatial configuration of n dimensions determined by n+1 points in a space of dimension equal to or greater than n. In other words, a-simplex is a geometric spatial element having the minimum number of boundary points necessary to enclose a space in a given number of dimensions. For example, in two dimensions, a simplex comprises a triangle, together with the interior area bounded by the triangle (see FIG. 1.) Two points are insufficient to form a simplex in two-dimensional space because no area is bounded by the points (and the lines which interconnect them.) While four points may be sufficient to bound a two-dimensional area, they do not comprise the minimum number of boundary points by which the two-dimensional area can be bounded. In three dimensions, a simplex comprises a tetrahedron, which is bounded by four vertices (see FIG. 1.) In four dimensions, a simplex comprises a hyper-tetrahedron (sometimes referred to as a hypertet) having five vertices.

A mesh is a collection of elements that fill a space. These elements are representative of a system which resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

There is a fundamental difference between modeling systems in which there is a single fluid phase and those in which there are multiple phases. When there are multiple fluid phases, there is a convection and potentially a mixing of the phases. (It is assumed that there is a pressure which drives the fluids and causes the front between them to be transported.) The finite element model must therefore include convective operators or components. These operators would not be necessary if only one fluid phase were modeled, or if the multiple fluid phases were completely mixed or emulsified.

Figure 2:
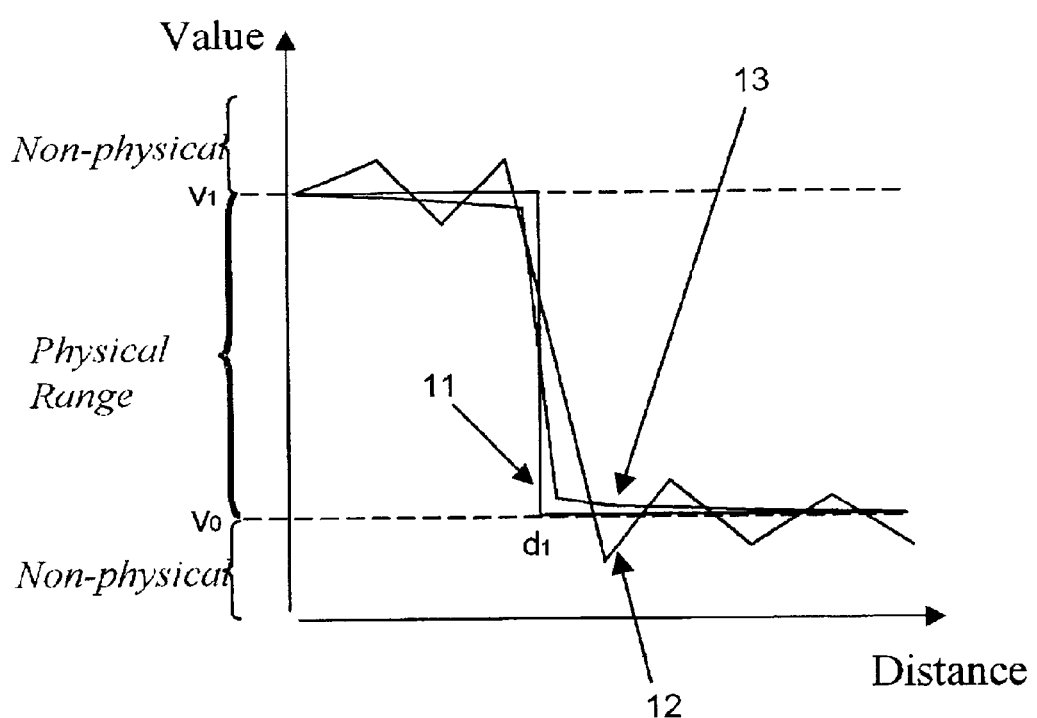
FIG. 2 is a diagram illustrating the difference between the actual values in the physical system and the solutions generated using traditional finite element techniques and techniques according to the present invention.

In a system having multiple fluid phases, characteristics of the system may change very abruptly. This situation is illustrated in FIG. 2. FIG. 2 is a diagram illustrating the difference between the actual values in the physical system and the solutions generated using traditional finite element techniques and techniques according to the present invention. It can be seen that the actual ("real world") values 11 form what is essentially a step function, changing from a first value v1 to a second value v0 immediately upon reaching a distance d1. In this example, the values v0 and v1 define the limits of the range of physically realizable values.

When traditional finite element techniques are used to model such a system, the solution will typically tend to oscillate. It can be seen in FIG. 2 that the solution 12 generated using these techniques oscillates above and below the actual physical values which it is attempting to model. Two of the most significant problems with this solution are the obvious inaccuracy (the solution does not closely track the actual values) and the fact that, at some points, the solution is greater than the maximum physically realizable value or less than the minimum physically realizable value. The oscillations which occur in solutions generated using traditional finite element techniques may therefore produce unrealistic results, or may even fail to converge at all.

Methods in accordance with this disclosure, however, do not suffer from these disadvantages because the solutions are constrained to be realistic. This constraint is achieved by ensuring that the matrix which governs the solution vector (i.e., the Jacobian matrix) satisfies the properties of monotonicity and preservation of linearity. In more practical terms, this consists of ensuring that all of the coefficients on the diagonal of the matrix are non-negative and that all of the coefficients off the diagonal of the matrix are non-positive. When the matrix has these characteristics, the solution remains realistic at all points, and more accurately tracks the behavior of the physical system, as indicated by curve 13 in FIG. 2. The model is therefore more likely to produce accurate results and to reliably converge.

The Jacobian matrix is derived from the partial differential equations that describe multiphase flow through porous media based on Darcy's law, and representing conservation of mass and momentum in the system. These equations are discretized onto the finite element mesh, and the coefficients of the equations form a matrix. Each coefficient will be either positive or negative, depending upon whether the gradient of the equation is positive or negative (i.e., whether the fluid flow is positive or negative). If the finite element technique is applied to the differential equations, a large set of algebraic equations is produced. That set of algebraic equations is nonlinear. The set of equations can be solved by using Newton's method (which involves taking the first derivative of the equations). The first derivative is the Jacobian matrix. The coefficients of this matrix are weighted to obtain a matrix which has non-negative terms on its diagonal and non-positive terms off the diagonal. The appropriate weighting of the terms ensures the monotonic and linear properties of the matrix.

The coefficients of the Jacobian matrix are essentially weighting factors for each of the nodes of the elements in the finite element mesh. In traditional finite element techniques, the nodes of an element are evenly weighted. For example, in a two-dimensional element, each of the three nodes would be weighted by ⅓. If a three-dimensional element were used, each of the four nodes of the element would be weighted by ¼. In the present methods, however, the nodes are weighted to reflect the flow of the fluids in the modeled system. This is illustrated with reference to FIGS. 3–6.

Figure 3:
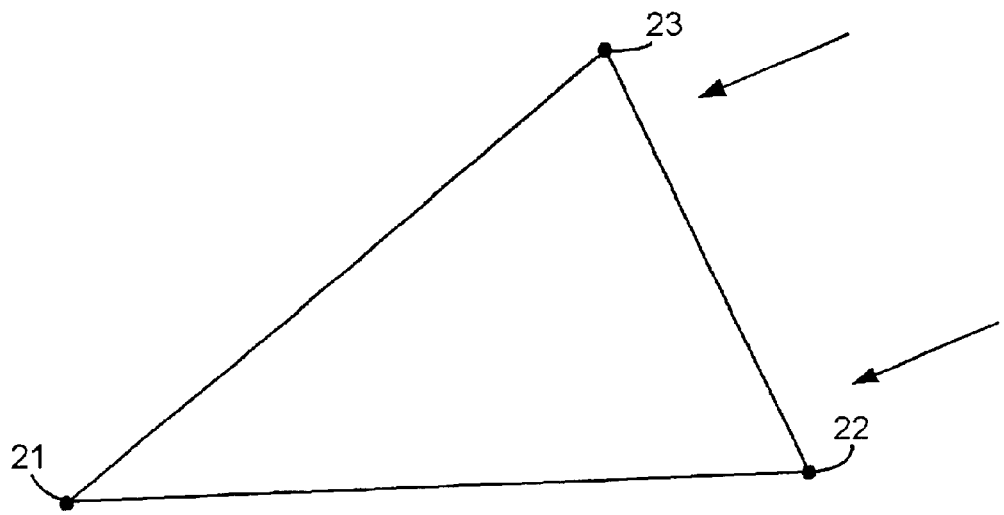
FIG. 3 is a diagram illustrating the flow of fluid across a first two-dimensional simplex element.
Figure 4:
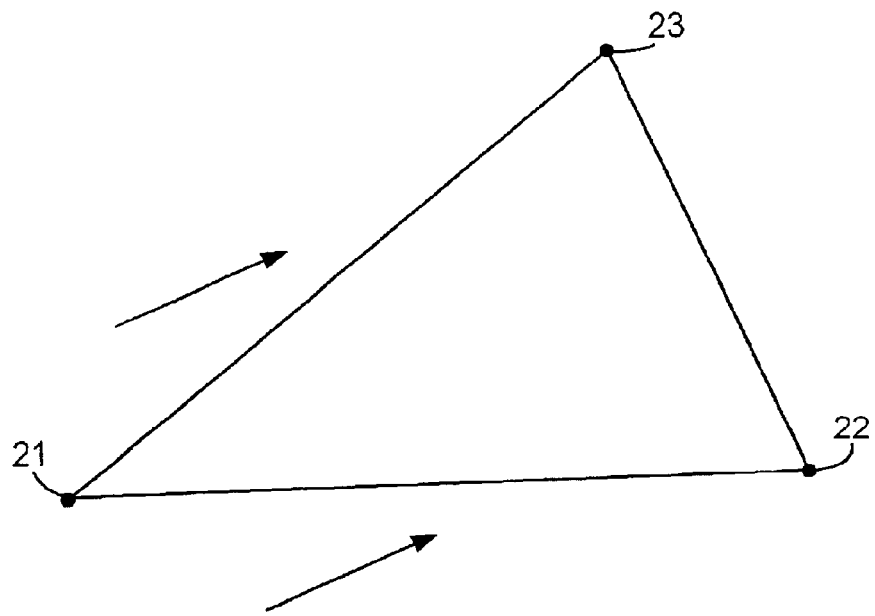
FIG. 4 is a diagram illustrating the flow of fluid across the first two-dimensional simplex element in a direction opposite the flow illustrated in FIG. 3.

FIG. 3 shows a single, two-dimensional element (a triangle). The flow of fluid with respect to the element is indicated by the arrows, which show that the fluid is flowing from the upper, right-hand portion of the figure to the lower, left-hand portion of the figure. Using traditional finite element techniques, each of nodes 21–23 would be evenly weighted (i.e., ⅓, ⅓, ⅓). Using the present techniques, the nodes are not evenly weighted. Because the fluid is flowing generally from nodes 22 and 23 to node 21, each of nodes 22 and 23 is weighted by ½, while node 21 is weighted by 0. Referring to FIG. 4, it can be seen that the weighting of the nodes is different when the direction of the fluid flow changes. In FIG. 4, the fluid flow is generally from the lower, left-hand portion of figure to the upper, right-hand portion of the figure. Consequently, node 21 is weighted by 1, while nodes 22 and 23 are weighted by 0.

Figure 5:
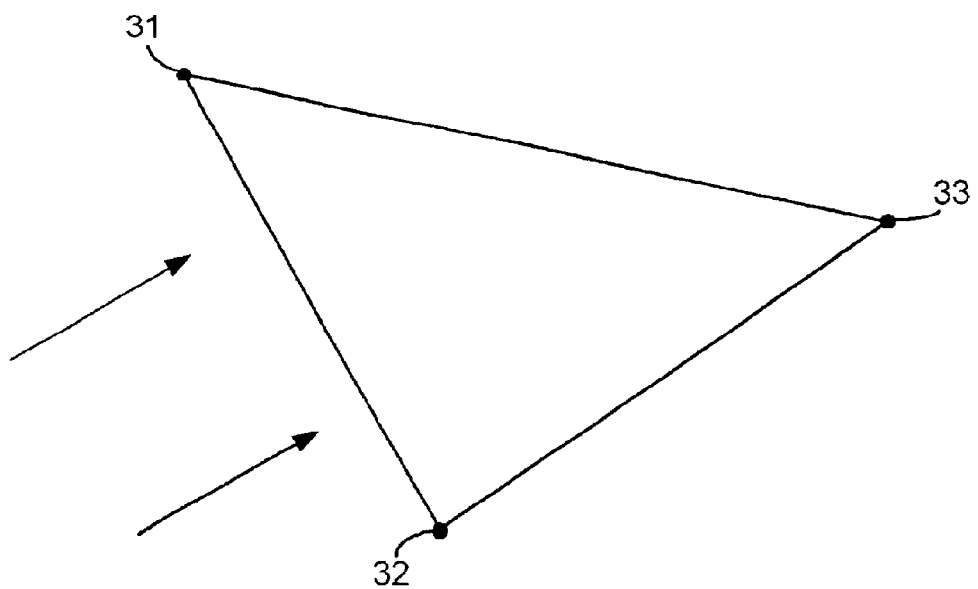
FIG. 5 is a diagram illustrating the flow of fluid across a second two-dimensional simplex element.
Figure 6:
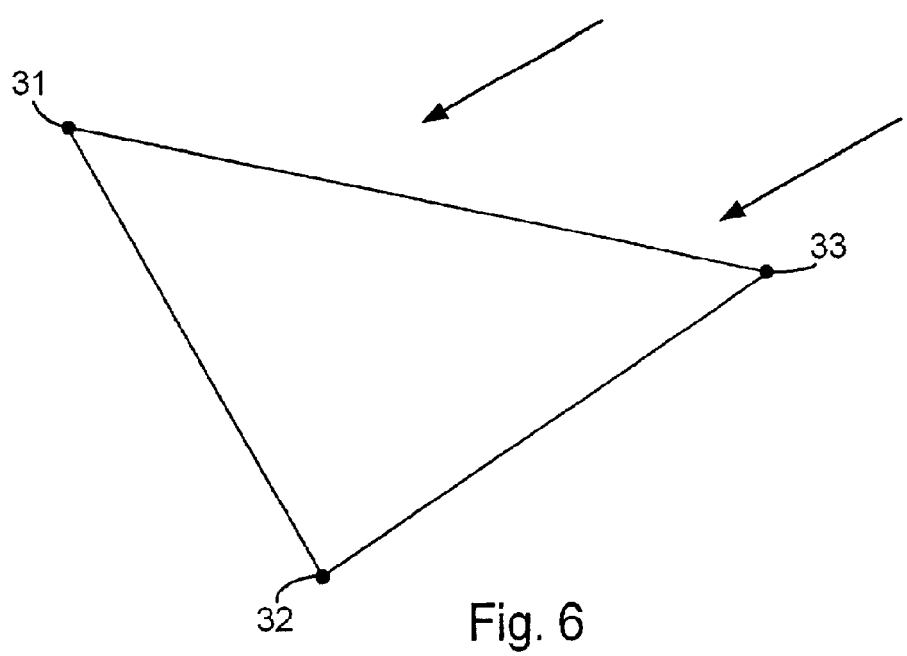
FIG. 6 is a diagram illustrating the flow of fluid across the second two-dimensional simplex element in a direction opposite the flow illustrated in FIG. 5.

Referring to FIGS. 5 and 6, it can be seen that the weighting of the nodes is also affected by the shape of the corresponding element. In FIG. 5, the flow of fluid is approximately perpendicular to an edge of the element. This situation is similar to that of FIG. 3, in which each of the nodes which terminates the forward edge of the element was weighted by ½. In that case, the remaining node of the element was downstream from a midway point on the forward edge of the element. In FIG. 5, the remaining node is instead directly downstream from one of the first to nodes. In this situation, the node 32 which is upstream from the last node 33 is weighted by ⅔, while the other upstream node 31 is weighted by ⅓. In FIG. 6, there is a single upstream node 33. Nodes 31 and 32 are both on the trailing edge of the element, so they are both weighted by 0. The upstream node 33, the other hand, is weighted by 1.

In each of these cases, the weighting of the nodes with respect to the direction of fluid flow effectively emphasizes the diagonal elements of the matrix, while reducing or eliminating the effect of the off-diagonal elements. This, in turn, ensures that the matrix has the properties of monotonicity and linearity.

Although the foregoing is sufficient to enable a person of ordinary skill in the field of finite element analysis to implement the present techniques, a brief technical discussion of the techniques follows.

Figure 7:
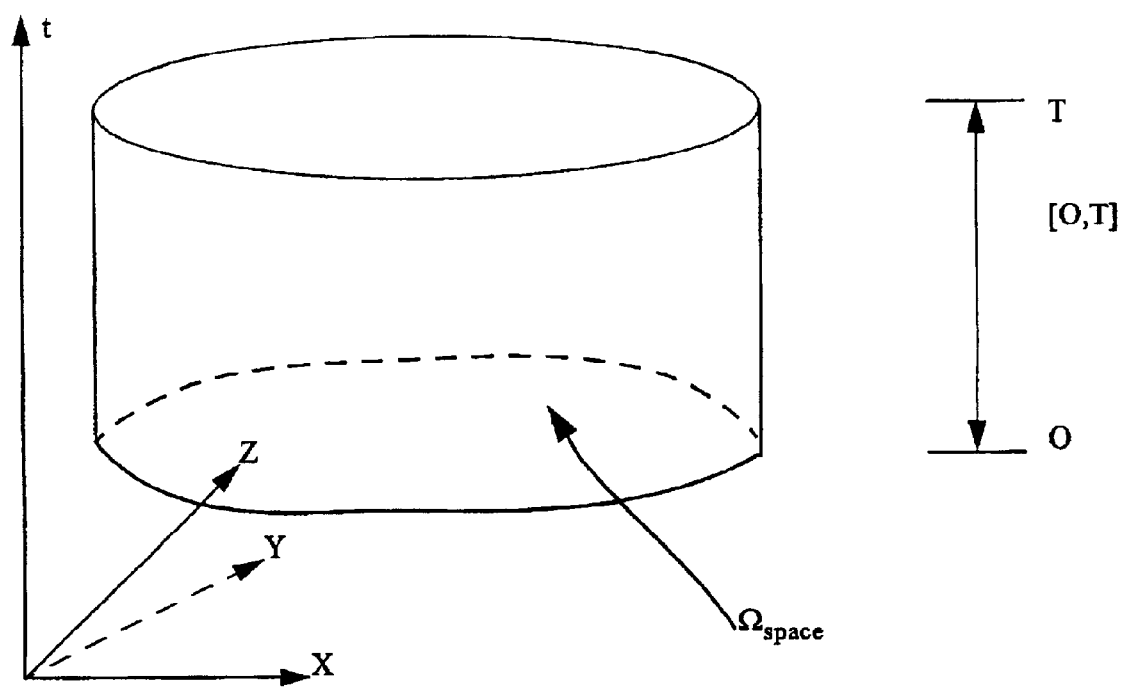
FIG. 7 is a diagram illustrating a two-dimensional projection of a time-space domain.

Considering a physical system which is to be modeled over time, a finite element mesh is first constructed (i.e., the system is discretized in the space-time domain). Referring to FIG. 7, a two-dimensional projection of the time-space domain is illustrated.

$\Omega = \Omega_{space} \times [0,T]$ is the space-time domain to be modeled, where $\Omega^3$.

$\Omega$ is broken down (segmented) into a plurality of non-overlapping sub-domains $\Omega_e$. Each of these sub-domains $\Omega_e$ and $$\bigcup_e \Omega_e = \bar{\Omega} \ \ e \in \{1, \ldots, N_E\}$$

comprises a four-dimensional simplex (a hypertetrahedron). A linear finite element basis is formed on each element ($\Omega_e$), and trial functions and test functions are defined on each element.

The flow of multi-phase fluids in porous media is governed by the equation:

$$\frac{\partial}{\partial t}\left(\phi \frac{S_i}{B_i}\right) + \nabla \cdot (V_i \lambda_i) = 0$$

Where:
  i=1, 2, . . . , nphases
  $V_i = -K(\nabla P_i + \rho_i g \nabla Z)$
  $P_1 = P$
  $P_i = P - P_{c_i}$, i=2, . . . , nphases $$\lambda_i = \frac{K_{r_i}}{\mu_i \beta_i}$$

$\mu_i$=Viscosity of i'th phase
  $B_i$=Formation Volume Factor of i'th phase
  $\rho_i$=Density of i'th phase
  $\phi$=Rock Porosity
  Z=Negative of Depth
  $S_i$=Saturation of i'th phase $$\sum_i^{nphase} S_i = 1$$

A standard Galerkin Finite Element discretization of $$(\bar{\Upsilon}_j^i) = \int_{\Omega_e} N_j \frac{\partial}{\partial t}\left(\left(\frac{\Phi S_i}{B_i}\right)_k N_k\right) + \left[-\int_{\Omega_e} \nabla N_j \cdot K(\nabla P_i + \rho_i g \nabla Z)\big|_{\Omega_e} \overline{(\lambda_i)}|_{\Omega_e}\right]$$

this multi-phase flow equation gives, for each element:

$$\bar{\Upsilon}_j^i = \left(\int_{\Omega_e} N_j \frac{\partial}{\partial t} N_k + \left|\int_{\Omega_e} N_j \frac{\partial}{\partial t} N_k\right|\right)\left(\frac{\Phi S_i}{B_i}\right)_k + (\Upsilon_j^i)_{spatial}$$

Figure 8:
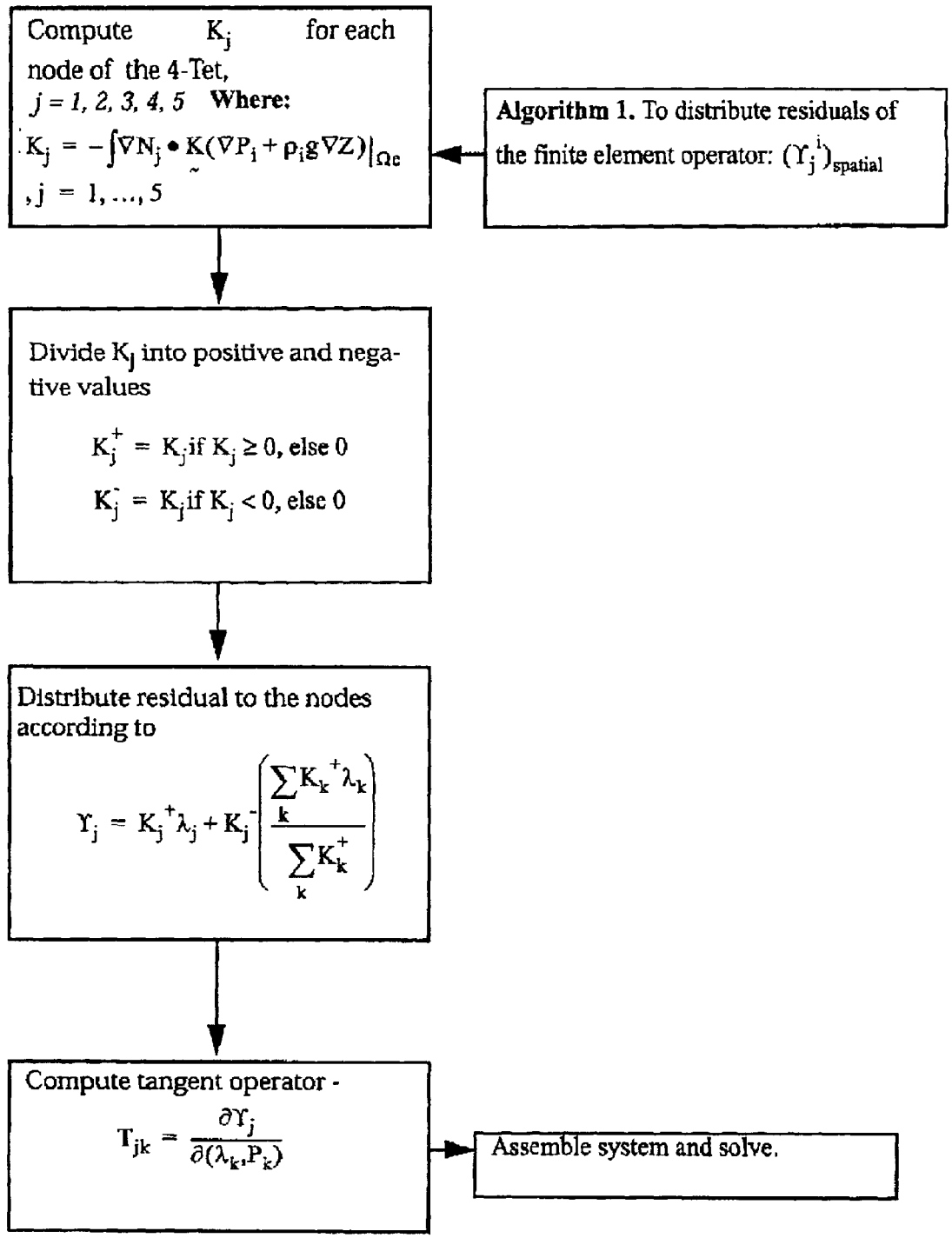
FIG. 8 is a flow diagram illustrating a method in accordance with one embodiment of the present invention.

The basic method of employing the present techniques is defined by the way that $\bar{\lambda}_i$ is defined. The present method is therefore defined as follows:

Referring to FIG. 8, a flow diagram illustrating a method in accordance with one embodiment of the present invention is shown. As indicated above, when the differential equations are discretized on the finite elements, they are basically converted from differential equations to algebraic relationships between the values of the nodes. This is accomplished by assuming that there is a linear variation of the corresponding property (e.g. saturation, pressure, permeability, prostate, etc.) between the nodes. This restricts the space of all possible solutions to only those solutions which are linear. When this assumption is used, a set of relations are derived from the differential equations for values of the coefficients which are linear over each element. When this is done, each element contributes a certain amount of the discretization to each one of its nodes. The contributions which are summed at each node are the residuals. It is desired to make the residuals equal 0 in order to solve the nonlinear algebraic system.

To distribute the residuals of the finite element operator $(\gamma_j^i)$, $K_j$ is first computed for each node of the 4-tet (hypertetrahedron). The resulting $K_j$ are divided into positive $(K_j^+)$ and negative $(K_j^-)$ values. The residual $\gamma_j$ is then distributed to the nodes, and the tangent operator $(T_{jk})$ is computed. The system is then assembled and solved in the same manner as if an ordinary finite element technique had been used. (Since the process by which finite element systems are assembled and solved is well known, it will not be described in further detail here).

The benefits and advantages which may be provided by the present invention have been described above with regard to specific embodiments. These benefits and advantages, and any elements or limitations that may cause them to occur or to become more pronounced are not to be construed as a critical, required, or essential features of any or all of the claims. As used herein, the terms "comprises," "comprising," or any other variations thereof, are intended to be interpreted as non-exclusively including the elements or limitations which follow those terms. Accordingly, a process, method, article, or apparatus that comprises a list of elements does not include only those elements but may include other elements not expressly listed or inherent to the claimed process, method, article, or apparatus.

While the present invention has been described with reference to particular embodiments, it should be understood that the embodiments are illustrative and that the scope of the invention is not limited to these embodiments. Many variations, modifications, additions and improvements to the embodiments described above are possible. Particularly, these variations may include computers or other data processing devices, computer readable media (such as floppy disks, CD-ROMs, DVD-ROMs, etc.,) storage devices, computer memories and the like which contain software, firmware or other programming embodying the foregoing methods. It is contemplated that these variations, modifications, additions and improvements fall within the scope of the invention as detailed within the following claims.

What is claimed is:

1. A method for solving a finite element model corresponding to a system in which there is a multi-phase fluid flow comprising:
generating a finite element matrix corresponding to the finite element model, wherein the finite element matrix contains a plurality of coefficients;
adjusting the coefficients to obtain the finite element matrix in which on-diagonal matrix entries are non-negative and off-diagonal matrix entries are non-positive, wherein adjusting the coefficients comprises weighting nodes of each mesh element according to a direction of fluid flow across the mesh element, wherein weighting the nodes of each mesh element according to a direction of fluid flow across the mesh element comprises determining the direction of fluid flow across the mesh element and weighting each node more heavily if the node is upstream from the other nodes of the mesh element and less heavily if the node is downstream from the other nodes of the mesh element; and
generating a solution for the finite element model using the finite element matrix using finite element techniques.

2. The method of claim 1 wherein each node is weighted more heavily if a greater portion of the mesh element is downstream from the node than from other nodes of the mesh element and less heavily if a smaller portion of the mesh element is downstream from the node than from other nodes of the mesh element.

3. The method of claim 1 wherein the finite element matrix corresponds to a system in which there are at least two fluid phases.

4. The method of claim 1 wherein the finite element matrix corresponds to a system in which there are three or more fluid phases.

5. The method of claim 1 wherein the finite element matrix corresponds to a four-dimensional finite element model.

6. The method of claim 1 wherein the system corresponds to an oil reservoir.

7. The method of claim 1 wherein the finite element matrix is configured to produce a solution which is not physically unrealistic at any time.

8. The method of claim 1 wherein the finite element matrix is configured to produce a solution which is non-oscillating.

9. The method of claims 1 further comprising discretizing a model of the system to produce a finite element mesh and generating the matrix based on the finite element mesh.

10. A computer-readable medium which contains a plurality of instructions, wherein the instructions are configured to cause a computer to perform the method for solving a finite element model corresponding to a system in which there is a multi-phase fluid flow comprising:
generating a finite element matrix correspond to the model, wherein the finite element matrix contains a plurality of coefficients;
adjusting the coefficients to obtain the finite element matrix in which on-diagonal matrix entries are non-negative and off-diagonal matrix entries are non-positive, wherein adjusting the coefficients comprises weighting nodes of each mesh element according to a direction of fluid flow across the mesh element, wherein weighting the nodes of each mesh element according to a direction of fluid flow across the mesh element comprises determining the direction of fluid flow across the mesh element and weighting each node more heavily if the node is upstream from the other nodes of the mesh element and less heavily if the node is downstream from the nodes of the mesh element; and
generating a solution for the model using the finite element matrix element techniques.

11. The computer-readable medium of claim 10 wherein each node is weighted more heavily if a greater portion of the mesh element is downstream from the node than from other nodes of the mesh element and less heavily if a smaller portion of the mesh element is downstream from the node than from other nodes of the mesh element.

12. The computer-readable medium of claim 10 wherein the finite element matrix corresponds to a system in which there are at least two fluid phases.

13. The computer-readable medium of claim 10 wherein the finite element matrix corresponds to a system in which there are three or more fluid phases.

14. The computer-readable medium of claim 10 wherein the finite element matrix corresponds to a four-dimensional finite element model.

15. The computer-readable medium of claim 10 wherein the system corresponds to an oil reservoir.

16. The computer-readable medium of claim 10 wherein the finite element matrix is configured to produce a solution which is not physically unrealistic at any time.

17. The computer-readable medium of claim 10 wherein the finite element matrix is configured to produce a solution which is non-oscillating.

18. The computer-readable medium of claim 10 wherein the method further comprises discretizing a model of the system to produce a finite element mesh and generating the finite element matrix based on the finite element mesh.

19. A method of predicting fluid flow in a fluid reservoir, the method comprising:
generating a mesh representation of the fluid reservoir having a plurality of mesh elements defined by a plurality of nodes, each of the plurality of mesh elements representative of a regional portion of the fluid reservoir;
generating a matrix-based representation of fluid flow comprising matrix elements associated with a mesh element; and
selectively weighting the matrix elements based on fluid flow direction in the regional portion of the fluid reservoir represented by the mesh element associated with the matrix element by weighting each node of the mesh element more heavily if the node is upstream from the other nodes of the mesh element and less heavily if the node is downstream from the other nodes of the mesh element.

20. The method of claim 19, wherein the fluid reservoir is a hydrocarbon reservoir.

21. The method of claim 19, wherein the matrix-based representation comprises a four-dimensional finite element representation.

22. The method of claim 19, wherein the matrix-based representation of fluid flow corresponds to a system in which there are at least two fluid phases.

23. The method of claim 19, wherein the matrix-based representation of fluid flow corresponds to a system in which there are three or more fluid phases.

* * * * *

UNITED STATES PATENT AND TRADEMARK OFFICE
CERTIFICATE OF CORRECTION

PATENT NO. : 7,027,964 B2
APPLICATION NO. : 09/896137
DATED : April 11, 2006
INVENTOR(S) : Stephen R. Kennon It is certified that error appears in the above-identified patent and that said Letters Patent is hereby corrected as shown below:

In column 7, line 25, please delete "where $\Omega^3$" and insert --where $\Omega_{space}\varepsilon^3$ .

In the Claims section, column 10, line 10, please insert the words --using finite-- after the before the word "element".

Signed and Sealed this

Twenty-ninth Day of August, 2006

JON W. DUDAS
*Director of the United States Patent and Trademark Office*